(12) United States Patent
Braddell et al.

(10) Patent No.: US 6,995,405 B2
(45) Date of Patent: Feb. 7, 2006

(54) ILLUMINATOR

(75) Inventors: Jules Braddell, Cork (IE); Kieran Kavanagh, Kenturk (IE); Anthony Herbert, Cork (IE)

(73) Assignee: Plasma Ireland Limited, Cork (IE)

( * ) Notice: Subject to any disclaimer, the term of this patent is extended or adjusted under 35 U.S.C. 154(b) by 0 days.

(21) Appl. No.: 10/689,641

(22) Filed: Oct. 22, 2003

(65) Prior Publication Data

US 2004/0080939 A1   Apr. 29, 2004

Related U.S. Application Data

(63) Continuation of application No. PCT/IE02/00053, filed on Apr. 23, 2002.

(30) Foreign Application Priority Data

Apr. 23, 2001 (IE) ................................. 2001/0402
Sep. 13, 2001 (IE) ................................. 2001/0827

(51) Int. Cl.
*H01L 29/18* (2006.01)
*H01L 29/22* (2006.01)
*H01L 29/24* (2006.01)
*H01L 33/00* (2006.01)

(52) U.S. Cl. .......................... 257/99; 257/88; 257/100
(58) Field of Classification Search ................. 362/36; 257/88, 99, 100
See application file for complete search history.

(56) References Cited

U.S. PATENT DOCUMENTS

| | | | | |
|---|---|---|---|---|
| 3,950,844 A | * | 4/1976 | Wisbey ........................ 438/28 |
| 5,479,029 A | | 12/1995 | Uchida et al. ................. 257/81 |
| 5,638,391 A | * | 6/1997 | Shima et al. ................... 372/44 |
| 5,698,866 A | * | 12/1997 | Doiron et al. ................. 257/99 |
| 5,857,767 A | * | 1/1999 | Hochstein .................... 362/294 |
| 6,045,240 A | * | 4/2000 | Hochstein .................... 362/294 |
| 6,188,527 B1 | * | 2/2001 | Bohn .......................... 359/710 |
| 6,517,218 B2 | * | 2/2003 | Hochstein .................... 362/294 |
| 6,634,771 B2 | * | 10/2003 | Cao ............................ 362/294 |
| 6,864,513 B2 | * | 3/2005 | Lin et al. ...................... 257/99 |

FOREIGN PATENT DOCUMENTS

| | | |
|---|---|---|
| DE | 2315709 | 10/1974 |
| EP | 0560605 A1 | 9/1993 |
| GB | 2276032 A | 9/1994 |

(Continued)

OTHER PUBLICATIONS

Patent Abstracts of Japan, vol. 8, No. 123, Jun. 8, 1984 & JP 59 035492A (Tokyo Shibaura Denki) , Feb. 27, 1984.

(Continued)

*Primary Examiner*—Nathan J. Flynn
*Assistant Examiner*—Victor A. Mandala, Jr.
(74) *Attorney, Agent, or Firm*—Jacobson Holman PLLC

(57) ABSTRACT

An illuminator (1) comprises a substrate (2) supporting light source dies (4) driven via wire bonds (5). The substrate (2) comprises a silicon strip (20) in direct contact with a brass heat sink (3), thus providing for excellent heat transfer away from the die (4). Pads (10, 11, 12) of Ni, Ti, and Ag sub-layers support the die (4) and the wire bonds (5). These both provide electrical connections for the die (4) and also light reflection upwardly because the Ag sub-layers of the pads (10, 11, 12) are evaporated over a thermally grown oxide layer (21) on the Si (20). The oxide has a very high dielectric strength, thus maintaining excellent electrical insulating properties over a large voltage range.

12 Claims, 3 Drawing Sheets

FOREIGN PATENT DOCUMENTS

| | | | |
|---|---|---|---|
| JP | 358222578 | * | 12/1983 |
| WO | WO02/05357 | | 1/2002 |

OTHER PUBLICATIONS

Patent Abstracts of Japan, vol. 17, No. 344, Jun. 29, 1993 & JP 05 048073A (Hitachi Ltd), Feb. 26, 1993.

Patent Abstracts of Japan, vol. 12, No. 54, Feb. 18, 1988 & JP 62 200776A (Alps Electric Co), Sep. 4, 1987.

Patent Abstracts of Japan, vol. 17, No. 453, Aug. 19, 1993 & JP 05 102522A (Stanley Electric Co), Apr. 23, 1993.

* cited by examiner

ILLUMINATOR

This is a continuation of PCT/IE02/00053 filed Apr. 23, 2002 and published in English.

FIELD OF THE INVENTION

The invention relates to illuminators for applications such as machine vision systems.

PRIOR ART DISCUSSION

Illuminators based on light emitting diodes (LEDs) are widely used for machine vision, sensing, alignment, medical, sorting, ambient lighting and other applications. For many applications such as line sources, backlights and ring lights, attributes of high power density and uniformity at the target are desirable.

Such attributes are not readily available from LEDs. These are grain sized die of semiconductor material which emit light when an electric current is passed through the device. The light emitted from an LED die is highly non-directional, being quasi-isotropic, and is spatially non-uniform in radiant intensity (defined as the radiant flux emitted per space angle, W/sr).

In one prior approach, to address the problems of non-directionality and non-uniformity LED die have been packaged by mounting each die inside a metal reflecting cup, the whole then being surrounded by an encapsulating epoxy or plastics material in the shape of a lens. Degrees of directionality and uniformity of light output are achieved by the operation of the shaped reflector and by the lensing effect. A disadvantage is that the space occupied by a packaged LED is much larger than the space occupied by a LED die so that packing density is greatly reduced in the case of arrays of packaged LEDs. To produce an illuminator, one or two dimensional arrays of packaged LEDs are mounted onto circuit boards in rows and/or columns, in circles or other geometries, commonly called stuffing. This method suffers from disadvantages:

- The low packing density of the packaged LEDs results in low output power and hence low irradiance at the target.
- The packaged LEDs cannot be mounted on the circuit board in a sufficiently controlled manner to ensure that the optical axis of each LED is identically aligned in the desired direction. Thus, light distribution and uniformity is non-optimum and there is generally a divergence of up to about 20° between the mechanical axis of the illuminator and its optical axis, again producing non-optimum irradiance at the target.
- Diffusers over the top of the packaged LED arrays are required to blur out the contributions of the individual LEDs and give some level of uniformity. Such diffusers cause loss of emitted light due to internal reflection and thus reduce the overall efficiency of the illuminator.
- Design flexibility is limited due to the need to produce a new circuit board for each design.
- Thermal management is difficult due to the insulating properties of the circuit board and the LED die encapsulation. Excessive heat reduces efficiency and LED lifetime.
- Large footprint and volume. This is a serious issue for many applications due to space constraints in fitting illuminators into many systems.

A further approach uses chip and wire technology, in which the individual die are bonded directly onto a circuit board in arrays. One such approach is that described in European Patent Specification No. 0560605. The whole board with die is encapsulated in epoxy for protection of the die and bonds. This provides improved packing density, but such density is limited by the critical dimensions available from printed circuit board (PCB) technology. This limit on packing density is particularly acute where a multiple wavelength illuminator is required. Such an illuminator requires a multiplicity of metal interconnect tracks for electrical biasing and driving of the different LEDs needed, one type for each wavelength. The pattern size limitations of PCB technology mean that the LEDs have to be more widely spaced apart in multiple wavelength illuminators thus reducing packing density and increasing size and bulk. Another problem is that there appears to be significant internal absorption within the illuminator. A further problem is heat build-up due to the thermal insulating properties of the epoxy.

The invention is therefore directed towards providing an illuminator and method of production to achieve improved power density and uniformity at a target.

Another object is to achieve improved robustness and reliability in an illuminator.

SUMMARY OF THE INVENTION

According to the invention, there is provided an illuminator comprising light sources mounted on a substrate and an integrally moulded lens covering the light sources, characterised in that,

- the substrate comprises a layer of semiconductor material and pads of conductive and reflective material overlying the semiconductor material,
- said pads are electrically connected to the light sources to provide power, and
- the substrate is mounted directly on a heat sink.

In one embodiment, the moulded lens material extends completely over the substrate and a top portion of the heat sink to hermetically seal the substrate and the light sources.

In another embodiment, the substrate comprises a layer of electrically-insulating material over the semiconductor material and the pads overlie said electrically-insulating layer.

In a further embodiment, said electrically-insulating material comprises an oxide of the semiconductor material.

In one embodiment, the oxide is thermally grown and has a dielectric strength in excess of $5 \times 10^6$ V/cm.

In another embodiment, the oxide comprises $SiO_2$.

In one embodiment, the oxide depth is at least 2 microns.

In another embodiment, the pads comprises reflective silver or gold.

In a further embodiment, the pads comprise a top sub-layer of a reflective metal over at least one adhesion sub-layer.

In one embodiment, said adhesion sub-layer comprises Ti.

In another embodiment, said adhesion sub-layer comprises Ni.

In a further embodiment, said sub-layers are deposited by evaporation over the oxide of the semiconductor material.

In one embodiment, said sub-layers each have a depth in the range of 50 nm to 3 microns.

In another embodiment, said light sources comprise semiconductor die placed and wire bonded on said tracks.

According to another aspect, the invention provides a method of producing an illuminator of the type comprising light sources mounted on a substrate and an integrally moulded lens covering the light sources, the method comprising the steps of:

providing a semiconductor material base, depositing pads of electrically conductive and optically reflective material on the base to provide a substrate, placing the light sources and electrical connectors on the pads of the substrate, adhering the substrate at a lower surface of the base to a heat sink, and moulding a lens over and around the substrate to hermetically seal the substrate and the light sources.

In one embodiment, the invention comprises the further step of growing an oxide layer on a surface of the base, and depositing the pads on the oxide layer.

In another embodiment, the oxide layer is grown to a depth of at least 2 microns.

In a further embodiment, the base is of silicon material and the oxide is silicon dioxide.

In one embodiment, the pads are deposited by patterning with use of a photo-resist.

In another embodiment, the lens is moulded by placing the substrate upside-down in a mould cavity and filling the cavity until liquid lens material surrounds the substrate.

In a further embodiment, the mould is sloped during filling, and the cavity is filled from the higher end.

DETAILED DESCRIPTION OF THE INVENTION

BRIEF DESCRIPTION OF THE DRAWINGS

The invention will be more clearly understood from the following description of some embodiments thereof, given by way of example only with reference to the accompanying drawings in which.

DESCRIPTION OF THE EMBODIMENTS

Figure 1:
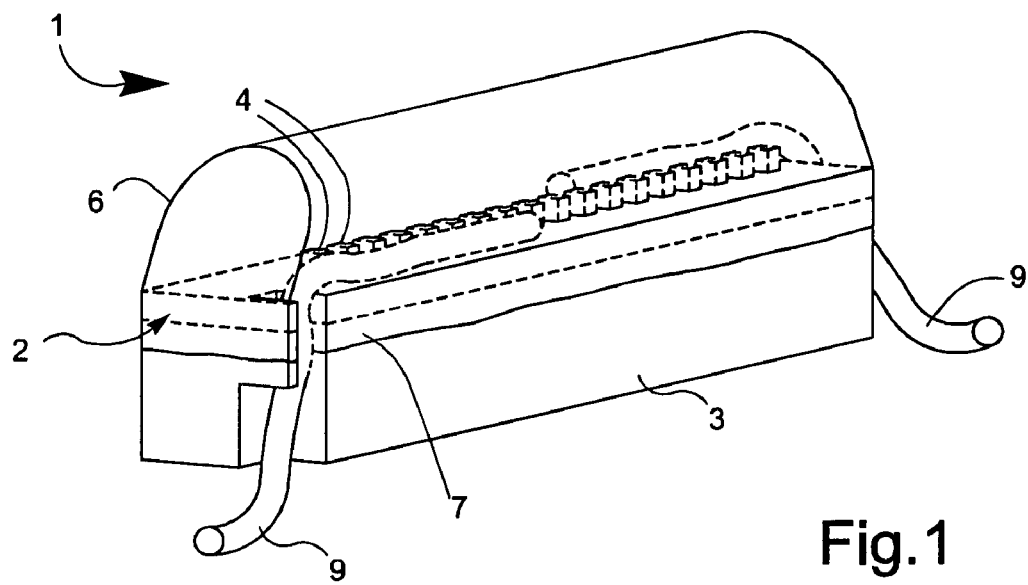
FIG. 1 is a perspective view of an illuminator of the invention.

Referring to FIG. 1 an illuminator 1 is illustrated. The illuminator 1 has a linear configuration for emission of a uniform line of light on a target with a high power density. The illuminator 1 may be used alone or a number of them may be mounted together in a desired configuration according to the application.

The illuminator 1 comprises a planar substrate 2 mounted on a brass heat sink 3 of rectangular block shape. The substrate 2 supports a line of light emitting semiconductor die 4 and bond wires 5 for activation. A semi-elliptical body 6 of transparent epoxy is moulded over the substrate 2 and it overlaps the sides of the substrate 2 and the top of the heat sink's sides to form an hermetic seal. The overlapping portion is indicated by the numeral 7.

Figure 2:
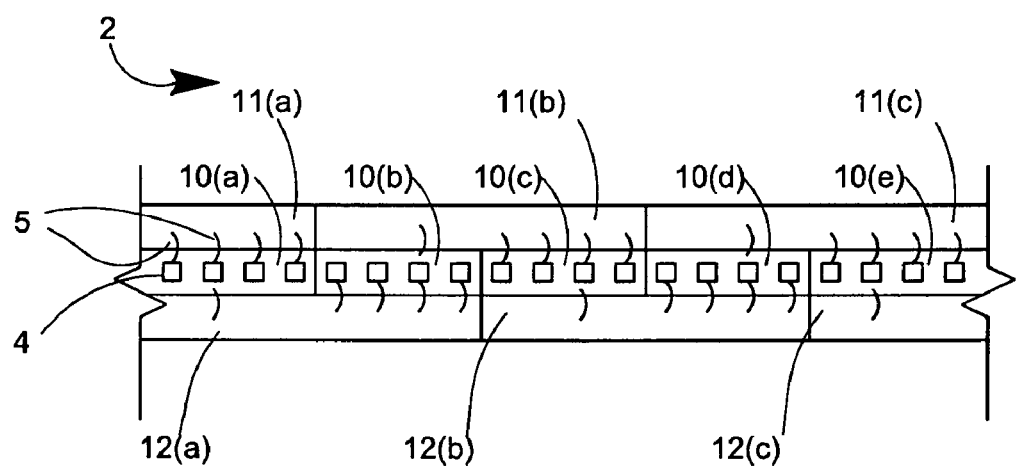
FIG. 2 is a larger scale plan view of part of the substrate of the illuminator.

As shown in FIG. 2 the substrate 2 comprises a series of central tri-metal pads 10(a), 10(b), 10(c), and 10(d). There are also a series of lateral wire bond tri-metal pads 11(a), 11(b), and 11(c) on one side and a series 12(a), 12(b), and 12(c) on the other side. The die 4 are mounted in a straight line on the central pads 10 with a packing density of 4 per mm. The die 4 are of the AlGaAs type emitting at 660 nm wavelength. The wire bonds 5 bridge the dies 4 and the lateral pads 11 and 12.

Figure 3:
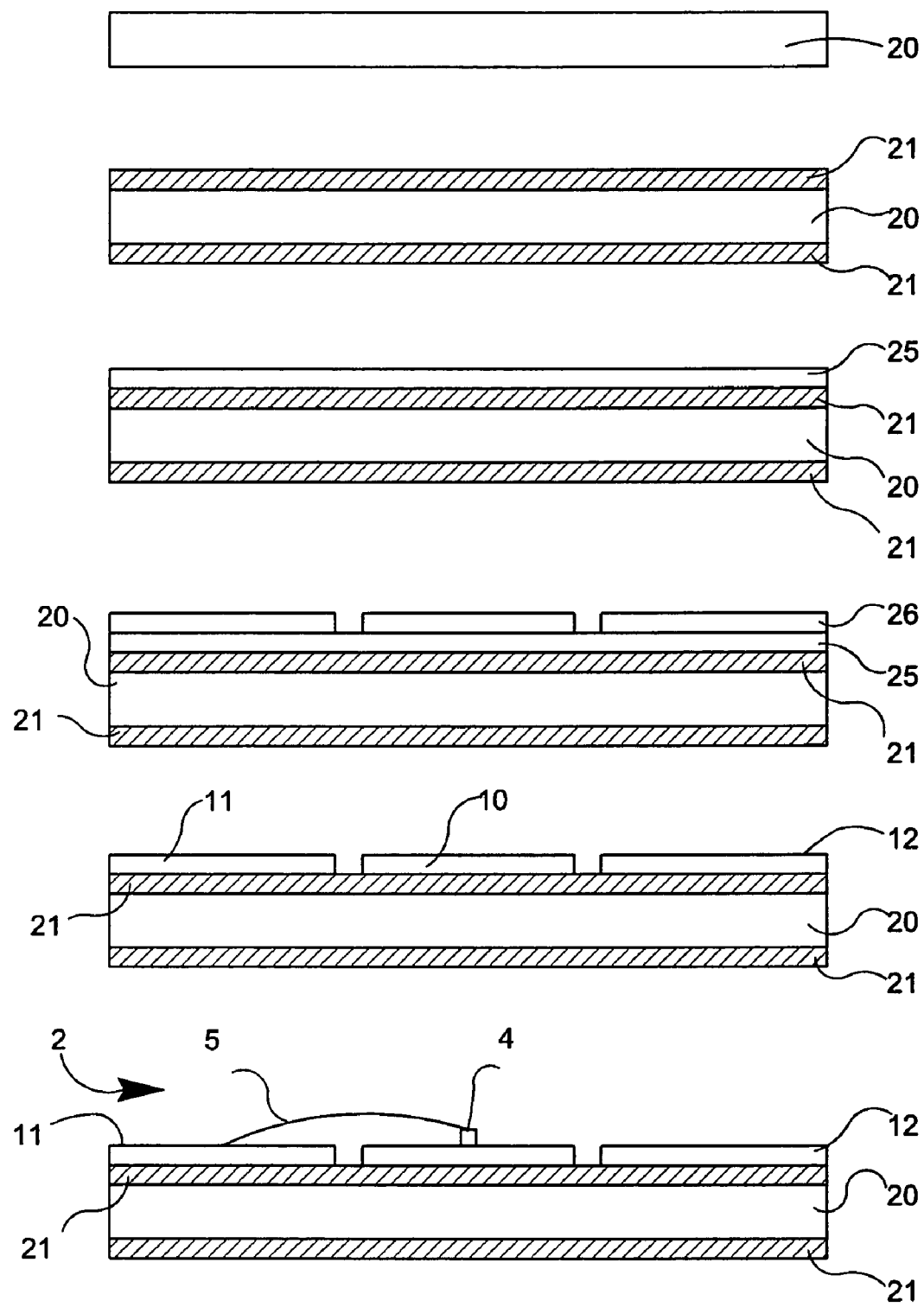
FIG. 3 is a flow diagram illustrating production of the substrate.

Referring to FIG. 3, production of the substrate 2 is now described. Initially, a silicon (Si) strip 20 of dimensions 50 mm long by 5 mm wide is provided. The Si acts as an excellent thermal conductor.

$SiO_2$ oxide 21 is then grown on both faces of the Si strip 20. The depth of the oxide 21 is 2 microns, and it is grown by thermal oxidation The top oxide layer is used for supporting the pads and it is an excellent electrical insulator for insulation of the pads 10, 11, and 12 and the wire bonds. Also, the dielectric strength is in the range of 5 to $10 \times 10^6$ V/cm. Thus, high voltages (in the range of 10V to 220V) may be applied to the illuminator without oxide breakdown.

In the next step a tri-metal layer 25 is grown over the top oxide layer 21. The metal sub-layers are grown by evaporation as follows:

Ti to a depth of 50 nm,

Ni to a depth of 50 nm, and

Ag to a depth of 1 to 3 microns, depending on the application.

The Ni and Ti are very effective primers for adhesion of the Ag layer, thus providing excellent stability.

The top sub-layer of silver (Ag) material is important because it plays both optical and electrical roles in operation of the illuminator 1. It is highly reflective so that a large proportion of light emitted by the dies 4 in the general plane of the substrate 2 is reflected upwardly and out of the epoxy body 6. Thus, the pads 10, 11, and 12 serve a dual purpose of conducting electrical power to the dies 4 (via the wire bonds 5) and of reflecting light upwardly to improve optical efficiency.

The next step is to pattern photoresist 26 over the layer 25 to define two exposed lines 0.7 mm wide on the tri-metal layer 25. The tri-metal layer 25 is then etched away by a chemical wet etch process to define the three electrically isolated pads 10, 11, and 12.

The dies 4 are then placed on the central track 10 using silver epoxy, and they are wire-bonded to the lateral tracks 11 and 12.

The process of FIG. 3 provides the loaded substrate 2. This is then adhered to the heat sink 3 using a highly thermal conductive epoxy.

Electrical leads 9 are soldered to the substrate 2 at the end pads.

Finally, a PTFE mould having cavities defining the shape of the illuminator 1 from the top of the heat sink 3 upwardly is used to mould the epoxy 6. This step is performed very quickly after deposition of the tri-metal layer to avoid oxidation on the Ag surface and thus ensure that it is highly reflective. The heat sink/substrate assembly is placed upside-down in the mould, and epoxy is injected underneath. The mould is shaped to ensure that the epoxy fills completely as it is injected the higher-level end and there is gravity flow. The mould is shaped to ensure that the epoxy 6 not only covers the substrate 2, but also extends downwardly over the top of the heat sink side edges to hermetically seal the whole unit. The mould is then baked at 80° C. for one hour to cure the epoxy.

In the above embodiment the silicon strip 20 is 5 mm wide, the pads 11 and 12 each being 1.9 mm wide. The length is 50 mm. However, the dimensions may be different to suit the required number of dies and their relative positions. Also, the dies may be of a variety of types in the one illuminator to achieve the desired colour illumination. There may, for example, be R, G, and B dies, and a separate lateral pad associated with each set. The technique for applying and patterning the tri-metal layer 25 allows excellent versatility for achieving a desired configuration of drive.

Regarding the epoxy 6, this is of the type marketed as E501™ by Epotecny of Levallois-Perrit, France. However, the epoxy composition and mould shape may be different to suit the particular application. For example, if a broader line of illumination is required the shape may be semi-cylindrical rather than semi-elliptical. There is excellent versatility because the desired light output spread is easily set by choice of mould shape.

Figure 4:
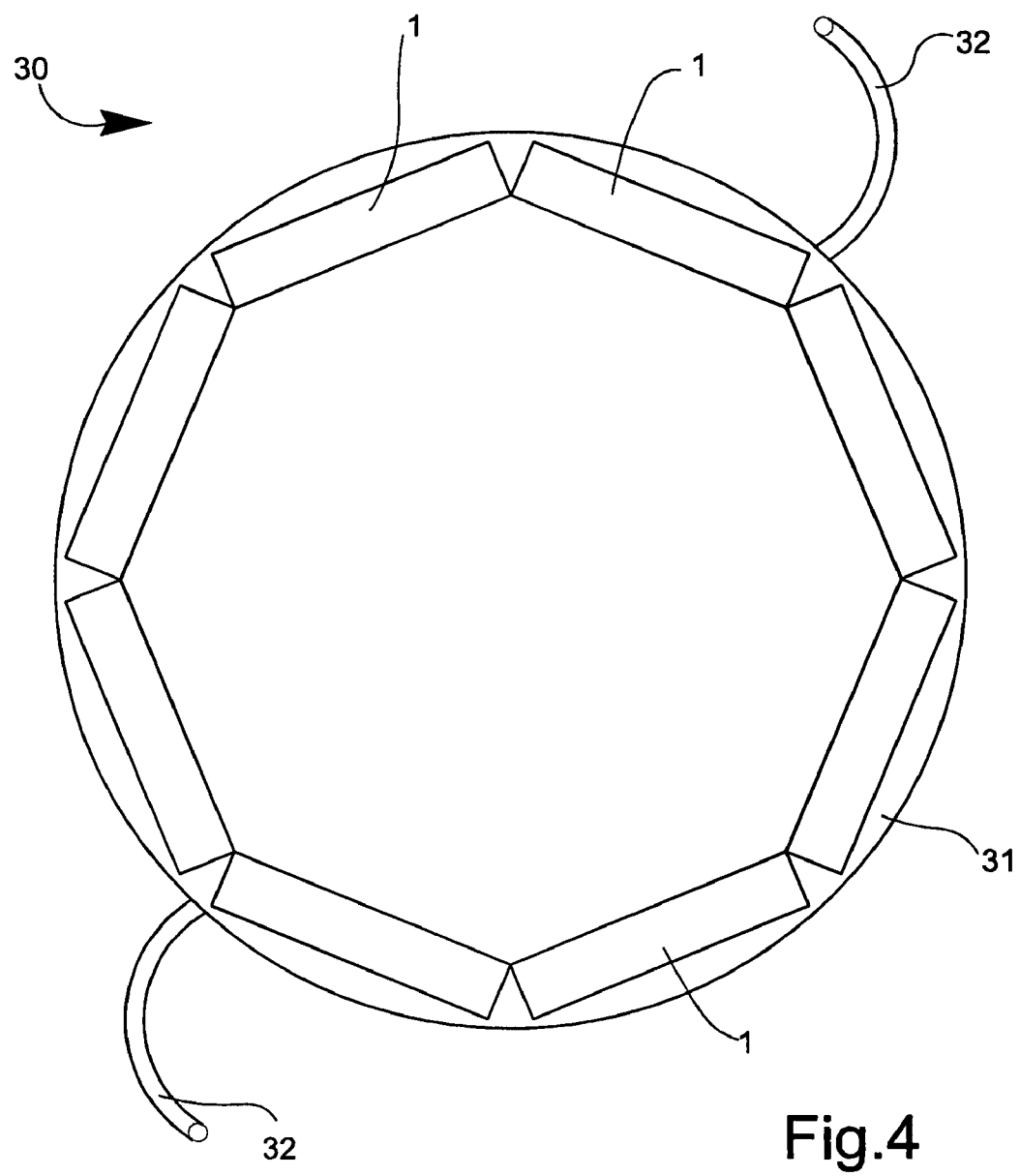
FIG. 4 is a plan view of a ring illuminator of the invention.

The illuminator 1 may be regarded as a building block for a composite illuminator having multiple such illuminators. For example, referring to FIG. 4 a ring illuminator 30 comprises eight illuminators 1 mounted in an inwardly-directed ring configuration on a plastics support 31. Where there is particularly high power and/or die density, the outer support may also be of a heat sink material.

It will be appreciated that the invention provides an illuminator which is very robust because of the epoxy/substrate/heat sink construction. There is also a large power density because of reflection from the Ag-surfaced tracks and the high die density. Also, there is a large voltage range of operation because of the high dielectric strength of the $SiO_2$ oxide. Furthermore reliability is excellent because of efficient heat transfer from the die 4 via the pads 10, the oxide, the silicon strip 20 and the heat sink 3. These provide a direct and highly efficient path for heat transfer. This is particularly important because the epoxy lens has a thermal insulating effect on the top of the substrate 2.

Another advantage is that excellent uniformity is achieved because of reflection of light from the Ag-surfaced pads 10, 11, and 12. This avoids the need for diffusion components in the epoxy, thus contributing to high power density.

The invention is not limited to the embodiments described but may be varied in construction and detail. For example, where the die emit in the IR band, the pads may be coated with Au for excellent reflectivity.

What is claimed is:

1. An illuminator comprising light sources mounted on a substrate and an integrally moulded lens covering the light sources, characterised in that, the substrate comprises a layer of semiconductor material and pads of conductive and reflective material overlying the semiconductor material, said pads are electrically connected to the light sources to provide power, and the substrate is mounted directly on a heat sink, wherein the substrate comprises a layer of electrically-insulating material over the semiconductor material and the pads overlie said electrically-insulating layer, and wherein said electrically-insulating material comprises an oxide of the semiconductor material.

2. The illuminator as claimed in claim 1, wherein the moulded lens material extends completely over the substrate and a top portion of the heat sink to hermetically seal the substrate and the light sources.

3. The illuminator as claimed in claim 1, wherein said light sources comprise semiconductor die placed on said pads and wire bonds between the die and tracks.

4. The illuminator as claimed in claim 1, wherein the pads comprise reflective silver or gold.

5. The illuminator as claimed in claim 4, wherein said sub-layers each have a depth in the range of 50 nm to 3 microns.

6. The illuminator as claimed in claim 1, wherein the oxide is thermally grown and has a dielectric strength in excess of $5 \times 10^6$ V/cm.

7. The illuminator as claimed in claim 6, wherein the oxide comprises $SiO_2$.

8. The illuminator as claimed in claim 6, wherein the oxide depth is at least 2 microns.

9. The illuminator as claimed in claim 1, wherein the pads comprise a top sub-layer of a reflective metal over at least one adhesion sub-layer.

10. The illuminator as claimed in claim 9, wherein said adhesion sub-layer comprises Ti.

11. The illuminator as claimed in claim 9, wherein said adhesion sub-layer comprises Ni.

12. The illuminator as claimed in claim 9, wherein said sub-layers are deposited by evaporation over the oxide of the semiconductor material.

* * * * *